(12) United States Patent
Urig et al.

(10) Patent No.: US 10,132,651 B2
(45) Date of Patent: Nov. 20, 2018

(54) CAPACITIVE SENSING SYSTEM WITH HARDWARE DIAGNOSTICS CONCEPT FOR DETECTION OF SENSOR INTERRUPTION

(71) Applicant: IEE International Electronics & Engineering S.A., Echternach (LU)

(72) Inventors: Christian Urig, Puttlingen (DE); Christoph Wendt, Mettendorf (DE)

(73) Assignee: IEE International Electronics & Engineering S.A., Echternach (LU)

( * ) Notice: Subject to any disclaimer, the term of this patent is extended or adjusted under 35 U.S.C. 154(b) by 0 days.

(21) Appl. No.: 15/560,915

(22) PCT Filed: Jan. 28, 2016

(86) PCT No.: PCT/EP2016/051754
§ 371 (c)(1),
(2) Date: Sep. 22, 2017

(87) PCT Pub. No.: WO2016/150594
PCT Pub. Date: Sep. 29, 2016

(65) Prior Publication Data
US 2018/0080802 A1   Mar. 22, 2018

(30) Foreign Application Priority Data

Mar. 23, 2015 (LU) .......................................... 92682

(51) Int. Cl.
*G01R 31/42* (2006.01)
*G01D 5/24* (2006.01)
(Continued)

(52) U.S. Cl.
CPC ............... *G01D 5/24* (2013.01); *B60N 2/002* (2013.01); *G01D 18/00* (2013.01)

(58) Field of Classification Search
CPC .. G01R 27/2605; G01R 31/028; G01R 15/16; G01R 31/42; G01R 19/0084;
(Continued)

(56) References Cited

U.S. PATENT DOCUMENTS 4,204,427 A * 5/1980 Gothe .................... G01F 23/263
324/665
4,347,478 A * 8/1982 Heerens .................... G01B 7/08
324/611
(Continued)

FOREIGN PATENT DOCUMENTS

DE    102013112909 A1    6/2014

OTHER PUBLICATIONS

J. Smith et al., Electric field sensing for graphical interfaces, IEEE Comput. Graph. Appl., 18(3): 1998, pp. 54-60.
(Continued)

*Primary Examiner* — Jermele M Hollington
*Assistant Examiner* — Taqi Nasir
(74) *Attorney, Agent, or Firm* — Reising Ethington P.C.

(57) ABSTRACT

A capacitance measurement circuit for determining a sense current of a capacitive sensor which includes at least one electrically conductive sense electrode and at least one electrically conductive guard electrode. The measurement circuit includes at least one switch member that is remotely controllable by a switch remote control unit, wherein the at least one switch member in at least one closed state is configured to provide an additional electrical path between the at least one guard electrode and a reference potential.

10 Claims, 2 Drawing Sheets

(51) Int. Cl.
  *B60N 2/00* (2006.01)
  *G01D 18/00* (2006.01)
(58) Field of Classification Search
  CPC ...... G01R 27/26; G01R 19/0092; G01R 1/30;
    G01R 31/025; G01R 31/3679
  USPC ..... 324/519, 750.17, 754.28, 548, 658, 661,
    324/686, 76.66
  See application file for complete search history.

(56) References Cited

U.S. PATENT DOCUMENTS

| | | | |
|---|---|---|---|
| 5,446,391 A | 8/1995 | Aoki et al. | |
| 8,354,936 B2 | 1/2013 | Ootaka | |
| 9,354,035 B2 | 5/2016 | Sieg | |
| 2010/0060300 A1* | 3/2010 | Muller | A61B 5/0408 324/686 |
| 2010/0315234 A1 | 12/2010 | Ootaka | |
| 2010/0315251 A1* | 12/2010 | Ootaka | B60N 2/002 340/667 |
| 2011/0187376 A1* | 8/2011 | Barrenscheen | G01R 31/3272 324/416 |
| 2011/0193573 A1* | 8/2011 | De Boer | G01B 7/023 324/686 |
| 2011/0315251 A1* | 12/2011 | Rampen | F16K 31/0696 137/561 R |
| 2013/0033381 A1* | 2/2013 | Breed | B60T 1/005 340/568.1 |
| 2013/0315234 A1* | 11/2013 | Kamble | H04L 49/254 370/385 |
| 2014/0091815 A1* | 4/2014 | Suwald | G06F 3/044 324/658 |
| 2014/0125357 A1* | 5/2014 | Blondin | G06F 3/044 324/658 |
| 2015/0367751 A1* | 12/2015 | Lamesch | B60N 2/002 297/180.12 |
| 2016/0075297 A1* | 3/2016 | Lamesch | B60N 2/002 324/603 |

OTHER PUBLICATIONS

International Search Report for International Application No. PCT/EP2016/051754, dated Apr. 11, 2016, 3 pages.
Written Opinion for International Application No. PCT/EP2016/051754, dated Apr. 11, 2016, 5 pages.

* cited by examiner

| capacitive sensor | $C_{meas}$ [pF] (closed) | $C_{meas}$ [pF] (open circuit) | $\Delta C_{meas}$ [pF] |
|---|---|---|---|
| functional | 110 | 30 | 80 |
| interrupted | 40 | 30 | 10 |

CAPACITIVE SENSING SYSTEM WITH HARDWARE DIAGNOSTICS CONCEPT FOR DETECTION OF SENSOR INTERRUPTION

TECHNICAL FIELD

The invention relates to a capacitive sensing system, a capacitance measurement circuit and a method of operating such capacitive sensing system with regard to capacitive sensor interruption diagnosis.

BACKGROUND OF THE INVENTION

Capacitive measurement and/or detection systems have a wide range of applications, and are among others widely used for the detection of the presence and/or the position of a conductive body in the vicinity of an electrode of the system. A capacitive sensor, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which could comprise the one or more antenna electrodes themselves—at which the influence of an object or living being on the electric field is detected.

The different capacitive sensing mechanisms are for instance explained in the technical paper entitled "*Electric Field Sensing for Graphical Interfaces*" by J. R. Smith et al., published in IEEE Comput. Graph. Appl., 18(3):54-60, 1998. The paper describes the concept of electric field sensing as used for making non-contact three-dimensional position measurements, and more particularly for sensing the position of a human hand for purposes of providing three-dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling.

The capacitive coupling is generally determined by applying an alternating voltage signal to a capacitive antenna electrode and by measuring the current flowing from said antenna electrode either towards ground (in the loading mode) or into the second electrode (receiving electrode) in case of the coupling mode. This current is often measured by means of a transimpedance amplifier, which is connected to the sensing electrode and which converts a current flowing into said sensing electrode into a voltage, which is proportional to the current flowing into the antenna electrode.

Some capacitive sensors are designed as sense-only capacitive sensors having a single sense electrode. Also, quite often capacitive sensors are used that comprise a sense electrode and a guard electrode that are proximally arranged and mutually insulated from each other. This technique of "guarding" is well known in the art and is frequently used for intentionally masking, and thus shaping, a sensitivity regime of a capacitive sensor. To this end, the guard electrode is kept at the same electric AC potential as the sense electrode. As a result, a space between the sense electrode and the guard electrode is free of an electric field, and the guard-sense capacitive sensor is insensitive in a direction between the sense electrode and the guard electrode.

For example, patent document U.S. Pat. No. 8,354,936 B2 describes a capacitive passenger detector for a vehicle. The capacitive passenger detector includes a main electrode, a sub-electrode and a guard electrode. The main electrode and the sub-electrode are separated apart from each other, and disposed in a seat of a vehicle. The guard electrode is disposed between the main electrode and a body of the vehicle, and separated apart from the main electrode. A sensitive characteristic measurement unit is configured for applying an alternating voltage signal to the main electrode, the sub-electrode and the guard electrode selectively or totally and for converting a current generated in the main electrode, the sub-electrode and the guard electrode to a voltage, respectively. The capacitive passenger detector further comprises a controller that defines a current flowing through the guard electrode to be a reference current when a voltage of the main electrode and a voltage of the guard electrode have the same potential. The controller defines a current flowing direction of the current flowing through the guard electrode to be a negative direction when the voltage of the main electrode is higher than the voltage of the guard electrode. The controller defines the current flowing direction of the current flowing through the guard electrode to be a positive direction when the voltage of the main electrode is lower than the voltage of the guard electrode. The controller corrects the voltage of the main electrode based on the current flowing through the guard electrode so that a corrected voltage of the main electrode is set to be a passenger determination data. Even when a potential difference is generated between the main electrode and the guard electrode, the controller detects the capacitance of the passenger correctly.

Capacitive sensing systems which are used in the control of airbag systems or other safety-related applications may be considered as safety-relevant system components. It may thus be necessary to monitor the good functioning of the different components of the sensor (sensing electrode and/or guard electrode) in order to rule out a false reading by the capacitive occupancy or proximity detection system.

With the currently available systems, complexity and costs that are required for detecting a sensor interruption, in particular a sense electrode interruption or a guard electrode interruption, are quite high. Current solutions include means such as but not limited to a complex interruption measurement circuit indeed, a diode between the sensing electrode and the guard electrode, a four-wire cable for foil sensor, four crimps, four connector pins, etc.

SUMMARY

It is therefore an object of the present invention to provide a less complex diagnose concept for a capacitive sensing system, in particular for use in automotive applications.

In one aspect of the present invention, the object is achieved by a capacitance measurement circuit for determining a sense current of a capacitive sensor that includes at least one electrically conductive sense electrode and at least one electrically conductive guard electrode that are proximally arranged and are mutually galvanically separated from each other.

The term "galvanically separated", as used in this application, shall particularly be understood to not conduct a direct current (DC) between galvanically separated objects.

The suggested capacitance measurement circuit comprises a periodic signal voltage source that is configured for providing an alternating measurement voltage with reference to a reference potential, wherein at least one of the at least one electrically conductive sense electrode and the at least one electrically conductive guard electrode is electrically connectable to the periodic signal voltage source for receiving the periodic measurement voltage, a sense current measurement circuit that is configured to determine the sense current that is indicative of a position of an object relative to the capacitive sensor, and at least one switch member that is remotely controllable by a switch remote control unit and has an open circuit state and at least one closed state, wherein the at least one switch member, in the at least one closed state, is configured to provide an additional electrical path between the at least one guard electrode and the reference potential.

The term "being configured to", as used in this application, shall in particular be understood as being especially programmed, laid out, furnished or arranged.

Based on observation, the inventors have determined that a measurement error will occur if a sense electrode and a guard electrode of the capacitive sensor are not kept at exactly the same AC potential. By intentionally changing an electric potential of the guard electrode by providing the additional electrical path to the reference potential, a voltage signal can be generated that can be used as an indication for a guard electrode interruption, wherein the interruption may include any interruption of electrical connections between the guard electrode and respective cabling and connecting members.

One particular advantage of at least some embodiments of the invention is that the voltage signal that is usable as an indication for guard electrode interruption is obtainable by a measurement of the sense current measurement circuit in the same way as a regular measurement to determine the sense current that is indicative of a position of an object relative to the capacitive sensor is carried out. In this way, an effort for additional hardware that is required for detecting a guard electrode interruption can be kept low.

Another feature of at least some embodiments of the invention is that the voltage signal obtained from intentionally changing the electric potential of the guard electrode by providing the additional electrical path is proportional to a capacitance between the sense electrode and the guard electrode. Thus, preferably a design of the capacitive sensor is laid out such that a capacitance between the sense electrode and the guard electrode is larger than or equal to 3 nF, more preferably larger than or equal to 5 nF and, most preferably, larger than 10 nF.

Preferably, the switch remote control unit can be formed by a microcontroller, which can enable a reliable and simple remote control of the at least one switch member and, in this way, a reliable detection of a guard electrode interruption.

Further, the switch remote control unit can be configured to periodically switch the remotely-controllable switch member from the open circuit state to the closed state for a predetermined time period and back to the open circuit state after the time period has elapsed. By selecting a suitable predetermined time period, a quasi-continuous monitoring for guard electrode interruption can be accomplished, while the capacitive sensor is in an operative state.

Also preferably, the capacitance measurement circuit further comprises a test capacitor that forms part of the additional electrical path between the at least one guard electrode and the reference potential. In this way, an amplitude of the voltage signal generated by intentionally changing the electrical potential of the guard electrode by providing the additional electrical path to the reference potential can be defined for optimizing a voltage signal difference obtained from a measurement in the open circuit state versus a measurement in the closed state.

In another aspect of the present invention, a capacitive sensing system is provided. The capacitive sensing system includes an embodiment of the capacitance measurement circuit disclosed beforehand, a switch remote control unit, and at least one capacitive sensor that is electrically connected to the periodic signal voltage source, wherein the at least one capacitive sensor includes at least one electrically conductive sense electrode and at least one electrically conductive guard electrode that are proximally arranged and mutually galvanically separated from each other.

In this way, a capacitive sensing system with an inherent detection means of little complexity for detecting sense or guard electrode interruption can be accomplished.

Preferably, the at least one capacitive sensor of the capacitive sensing system is configured for operation in loading mode.

With advantage, the switch remote control unit can be formed as a microcontroller. In this way, a reliable and simple remote control of the at least one switch member and a reliable detection of a sense or guard electrode interruption can be achieved.

Preferably, a capacitor formed by the at least one electrically conductive sense electrode and the at least one electrically conductive guard electrode has a capacitance value of at least 3 nF, more preferably of at least 5 nF, and, most preferably, of at least 10 nF. A large difference between an amplitude of the signal obtained from a measurement in the open circuit state of the switch member and an amplitude of the signal generated by intentionally changing the electrical potential of the guard electrode by providing the additional electrical path to the reference potential can be accomplished. By that, an effective and reliable detection of a guard electrode interruption can be achieved.

In yet another aspect of the invention, the object is achieved by a method of operating an embodiment of the capacitive sensing system as disclosed beforehand with regard to capacitive sensor interruption diagnosis.

The method includes steps of controlling the at least one switch member to be in the open circuit state, determining a first sense current value of the capacitive sensor, controlling the at least one switch member to be in the at least one closed state, determining a second sense current of the capacitive sensor, determining an absolute difference between the first sense current and the second sense current, comparing the determined absolute difference with a predetermined threshold value for the absolute difference of sense current, and generating an output signal that is indicative of a sensor interruption if the determined absolute difference is smaller than the predefined threshold value.

It is noted herewith that the terms "first" and "second" are used in this application for distinction purposes only, and are not meant to indicate or anticipate a sequence or a priority in any way.

As capacitance values can be determined from determined sense currents, determining a sense current is equivalent to determining a capacitance value. By applying the suggested method, an effective monitoring for guard electrode interruption can be accomplished.

A quasi-continuous monitoring for guard electrode interruption can be achieved, and the capacitive sensor operational availability is virtually unaffected, if the steps of the method are executed in a periodic manner.

Preferably, the method further comprises steps that are to be executed if the determined absolute difference is equal to or larger than the predefined threshold value. The steps are:

controlling the at least one switch member to be in the open circuit state, and resuming determining sense current values of the capacitive sensor.

These and other aspects of the invention will be apparent from and elucidated with reference to the embodiments described hereinafter.

BRIEF DESCRIPTION OF THE DRAWINGS

Further details and advantages of the present invention will be apparent from the following detailed description of not limiting embodiments with reference to the attached drawing, wherein.

DETAILED DESCRIPTION

Figures 1, 3:
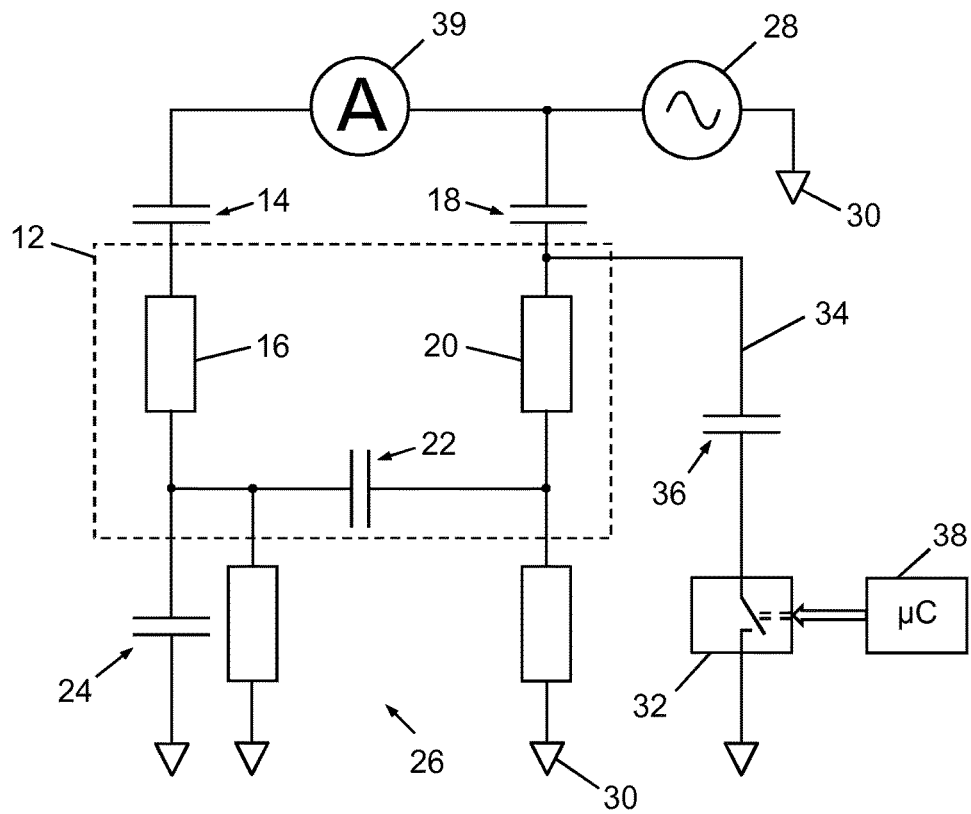
FIG. 1 illustrates an electric equivalent circuit diagram of a capacitive sensing system having a capacitance measurement circuit in accordance with the invention with an electrically connected capacitive sensor, in a symmetrized presentation.
FIG. 3 is a table showing exemplary test results from applying the method pursuant to FIG. 2.

FIG. 1 illustrates an electric equivalent circuit diagram of a capacitive sensing system 10 having a capacitance measurement circuit 26 in accordance with the invention. The capacitive sensing system 10 further includes a capacitive sensor 12 and a switch remote control unit 38 whose function will be described thereinafter.

The capacitive sensor 12 comprises an electrically conductive sense electrode and an electrically conductive guard electrode that are proximally arranged and mutually galvanically separated from each other. The sense electrode with the corresponding wiring is schematically represented by a sense resistor 16 and the guard electrode with the corresponding wiring is schematically represented by a guard resistor 20. Capacitor 14 represents a coupling capacitor for the sense electrode on the printed circuit board (PCB) and capacitor 18 represents a coupling capacitor for the guard electrode on the printed circuit board (PCB) A sense-to-guard impedance is well described by a sense-to-guard capacitor 22 electrically connected in parallel between the sense electrode and the guard electrode. In this specific embodiment, the sense-to-guard capacitor 22 has a capacitance of about 9 nF.

The capacitance measurement circuit 26 includes a periodic, namely sinusoidal, signal voltage source 28 that is configured for providing an alternating measurement voltage with reference to a reference potential 30 formed by ground potential, which for instance may be a vehicle ground potential. The sense electrode and the guard electrode are electrically connected to the periodic signal voltage source 28 for receiving the periodic measurement voltage. In this way, the guard electrode is kept at the same electric AC potential as the sense electrode.

The capacitance measurement circuit 26 includes a sense current measurement circuit that is configured for determining a sense current flowing through the sense electrode. The sense current measurement circuit is schematically represented as 39 in FIG. 1. Current measurement circuits are well known to those skilled in the art and therefore need not be described in further detail herein.

The capacitive sensor 12 is operated in loading mode. The sense current is indicative of a position of an object relative to the capacitive sensor 12. An object approaching the sense electrode is characterized by a capacitor 24 of unknown and varying capacitance that is connected to the reference potential 30. If the grounded object approaches the sense electrode, the unknown capacitance increases, and the sense current flowing between the sense electrode and ground potential is increased, indicating a closer proximity of the object to the capacitive sensor 12.

Although in this specific embodiment the capacitive sensor 12 is operated in loading mode and comprises one sense electrode and one guard electrode, other electrode configurations with different numbers of sense and guard electrodes, and other modes of operation of the capacitive sensor 12 as described in the introduction are also contemplated.

Moreover, the capacitance measurement circuit 26 includes a switch member 32 that is remotely controllable by the switch remote control unit 38, which is formed by a microcontroller. The switch member 32 has an open circuit state, in which switch contacts are not connected, and a closed state, in which switch contacts are connected to establish electrical contact.

In this specific embodiment, the switch remote control unit 38 forms part of the capacitive sensing system 10. However, in other embodiments the switch remote control unit may be formed by an external control unit that is electrically connectable to the switch member for control purposes.

The switch member 32, in the closed state, is configured to provide an additional electrical path 34 between the guard electrode and the reference potential 30. The capacitance measurement circuit 26 comprises a test capacitor 36 that forms part of the additional electrical path 34 between the guard electrode and the reference potential 30.

In the open circuit state of the switch member 32, the capacitance measurement circuit 26 is configured to determine a capacitance value of the unknown capacitor 24. In this state, the determined capacitance value is indicative of a position of the object relative to the capacitive sensor 12.

In the closed state of the switch member 32, the electric potential of the guard electrode is intentionally changed. As a result, a pattern of electrical currents flowing in the capacitance measurement circuit 26 will be changed. This change of electrical currents is different for a situation in which the guard electrode and its respective cabling and connectors are regularly connected from a situation in which an interruption has occurred within electrical connections of the guard electrode and its respective cabling and connectors. The difference in the change of electrical currents can be exploited for detecting a guard electrode interruption by applying a method described thereinafter.

As can be seen from the symmetrized illustration of the electric equivalent circuit diagram in FIG. 1, in the closed state of the switch member 32, additional electric currents will flow through the guard electrode and through the sense-to-guard capacitor 22.

Figure 2:
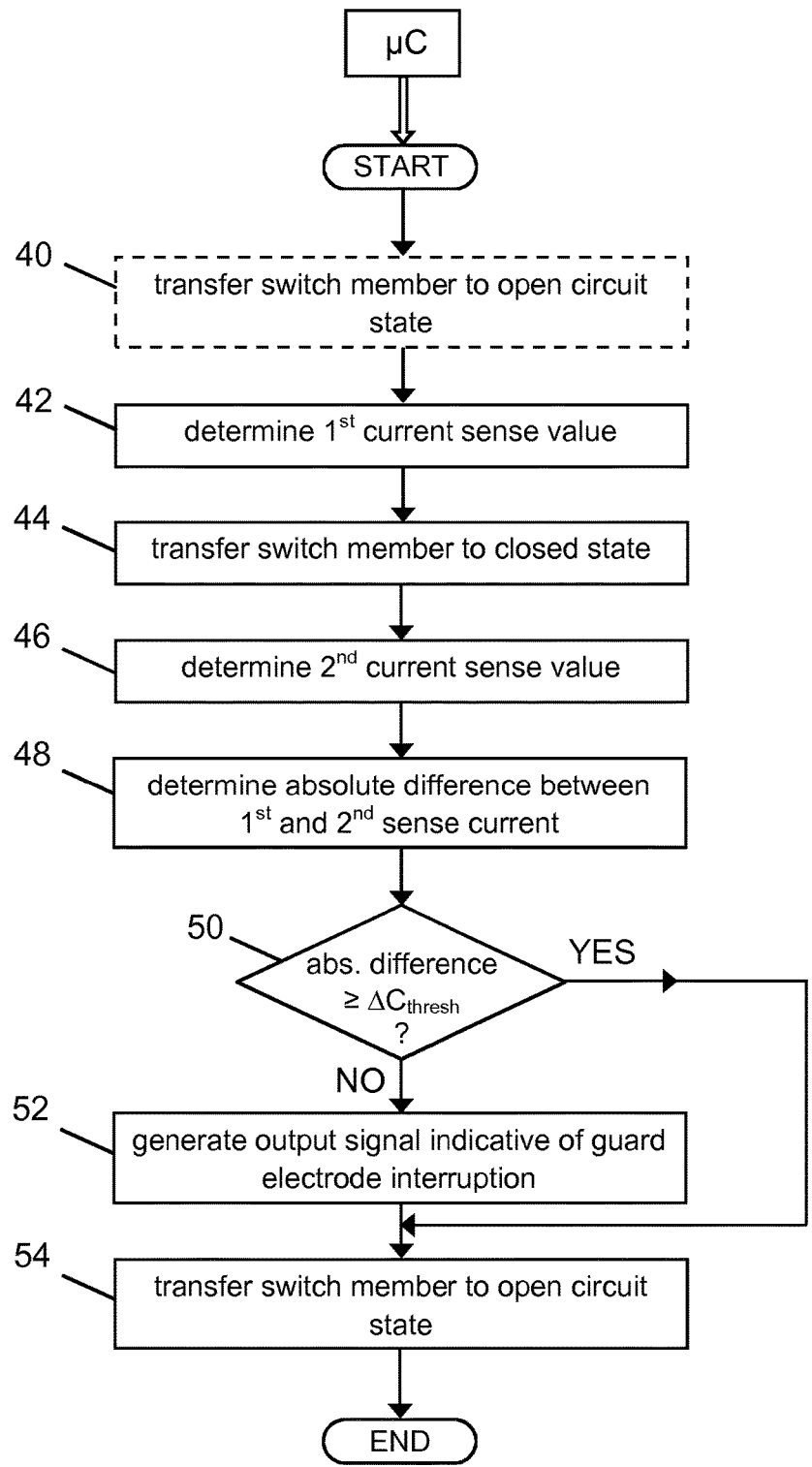
FIG. 2 is a flow chart of a method of operating the capacitive sensing system pursuant to FIG. 1.

In the following, an embodiment of a method of operating the capacitive sensing system 10 with regard to capacitive sensor interruption diagnosis will be described. A flowchart of the method is given in FIG. 2. In preparation of using the capacitive sensing system 10, it shall be understood that all involved units and devices are in an operational state and configured as illustrated in FIG. 1.

In a first step 40 of the method, the switch member 32 is controlled by the switch remote control unit 38 to be in the open circuit state. If the method is started with the capacitive sensor 12 in its regular operating mode, the switch member 32 should be in the open circuit state already, and the step 40 is merely a check of the state of the switch member 32, or the step 40 can be omitted. In the next step 42, a first sense current value of the capacitive sensor 12 is determined by the sense current measurement circuit. As described beforehand, determining a sense current is equivalent to determining a capacitance value of the unknown capacitor 24.

In another step 44, the switch member 32 is controlled by the switch remote control unit 38 to be in the closed state for a predetermined time period. Within this time period, a second sense current of the capacitive sensor 12 is determined by the sense current measurement circuit in a following step 46.

In the next step 48, an absolute difference between the first sense current and the second sense current (or, equivalent, between the first determined capacitance value and the second determined capacitance value) is determined by the microcontroller. The microcontroller, in the following step 50, compares the determined absolute difference with a predetermined threshold value $\Delta C_{thresh}$ for the absolute difference of sense current, and generates an output signal that is indicative of a sensor interruption in another step 52 if the determined absolute difference is smaller than the predefined threshold value $\Delta C_{thresh}$. The output signal may be transferred to another control unit, for instance a vehicle control unit in the case of automotive applications, by which it may be further processed and by which additional steps may be taken. Or, the output signal may be displayed on a display unit for alarming a user.

If the determined absolute difference is equal to or larger than the predefined threshold value $\Delta C_{thresh}$, the switch member 32 is controlled by the switch remote control unit 38 to be in the open circuit state again in the next step 54 after the predetermined time period has elapsed. In the following step, the determining of sense current values of the capacitive sensor is resumed, as no interruption of the guard electrode has been detected.

FIG. 3 is a table showing exemplary test results from applying the method. As can readily be taken from the numbers therein, a predefined threshold value $\Delta C_{thresh}$ of, for instance, 30 pF would be suitable for accomplishing a clear and robust detection of guard electrode interruptions.

The microcontroller is configured to initiate the steps of the method in a periodic manner, for instance with a period of 1 s. In this way, a quasi-continuous monitoring for guard electrode interruption can be established, and a capacitive sensor operational availability remains virtually unaffected.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A capacitance measurement circuit for determining a sense current of a capacitive sensor including at least one electrically conductive sense electrode and at least one electrically conductive guard electrode that are proximally arranged and mutually galvanically separated from each other, the capacitance measurement circuit comprising
   a periodic signal voltage source that is configured for providing an alternating measurement voltage with reference to a reference potential, wherein at least one of the at least one electrically conductive sense electrode and the at least one electrically conductive guard electrode is electrically connectable to the periodic signal voltage source for receiving the periodic measurement voltage,
   a sense current measurement circuit that is configured to determine the sense current that is indicative of a position of an object relative to the capacitive sensor, and
   at least one switch member that is remotely controllable by a switch remote control unit and has an open circuit state and at least one closed state, wherein the at least one switch member, in the at least one closed state, is configured to provide an additional electrical path between the at least one guard electrode and the reference potential.

2. The capacitance measurement circuit as claimed in claim 1, wherein the switch remote control unit is formed by a microcontroller.

3. The capacitance measurement circuit as claimed in claim 1, wherein the switch remote control unit is configured to periodically switch the remotely-controllable switch member from the open circuit state to the closed state for a predetermined time period and back to the open circuit state after the time period has elapsed.

4. The capacitance measurement circuit as claimed in claim 1, further comprising a test capacitor that forms part of the additional electrical path between the at least one guard electrode and the reference potential.

5. A capacitive sensing system including
   a capacitance measurement circuit as claimed in claim 1,
   a switch remote control unit, and
   at least one capacitive sensor that is electrically connected to the periodic signal voltage source, wherein the at least one capacitive sensor includes at least one electrically conductive sense electrode and at least one electrically conductive guard electrode that are proximally arranged and mutually galvanically separated from each other.

6. The capacitive sensing system as claimed in claim 5, wherein the switch remote control unit is formed as a microcontroller.

7. The capacitive sensing system as claimed in claim 5, wherein a capacitor formed by the at least one electrically conductive sense electrode and the at least one electrically conductive guard electrode has a capacitance value of at least 3 nF.

8. A method of operating the capacitive sensing system as claimed in claim 5 with regard to capacitive sensor interruption diagnosis, the method comprising steps of
    controlling the at least one switch member to be in the open circuit state,
    determining a first sense current value of the capacitive sensor,
    controlling the at least one switch member to be in the at least one closed state,
    determining a second sense current of the capacitive sensor,
determining an absolute difference between the first sense current and the second sense current,
    comparing the determined absolute difference with a predetermined threshold value for the absolute difference of sense current, and
    generating an output signal that is indicative of a sensor interruption if the determined absolute difference is smaller than the predefined threshold value.

9. The method as claimed in claim 8, further comprising steps that are to be executed if the determined absolute difference is equal to or larger than the predefined threshold value, of
    controlling the at least one switch member to be in the open circuit state, and
    resuming determining sense current values of the capacitive sensor.

10. The method as claimed in claim 8, wherein the steps are executed in a periodic manner.

* * * * *